United States Patent
Strachan et al.

(10) Patent No.: US 8,806,941 B2
(45) Date of Patent: Aug. 19, 2014

(54) EXTENSION SENSING ACTUATOR

(75) Inventors: Mel Strachan, Edinburgh (GB); Katherine Joanne Kirk, Paisley (GB); Alexander Cochran, Dundee (GB)

(73) Assignee: The Science and Technology Facilities Council, Wiltshire (GB)

(*) Notice: Subject to any disclaimer, the term of this patent is extended or adjusted under 35 U.S.C. 154(b) by 1196 days.

(21) Appl. No.: 12/601,548

(22) PCT Filed: May 27, 2008

(86) PCT No.: PCT/GB2008/001794
§ 371 (c)(1),
(2), (4) Date: Sep. 29, 2010

(87) PCT Pub. No.: WO2008/145983
PCT Pub. Date: Dec. 4, 2008

(65) Prior Publication Data
US 2011/0041610 A1 Feb. 24, 2011

(30) Foreign Application Priority Data
May 25, 2007 (GB) .................................. 0710078.7

(51) Int. Cl.
G01N 29/12 (2006.01)
G01B 17/04 (2006.01)
H01L 41/083 (2006.01)
H01L 41/08 (2006.01)

(52) U.S. Cl.
CPC .............. *G01B 17/04* (2013.01); *H01L 41/083* (2013.01); *H01L 41/0825* (2013.01)
USPC .......................................................... 73/579

(58) Field of Classification Search
USPC ............ 73/579, 658, 763; 310/322, 324, 326, 310/328, 334
See application file for complete search history.

(56) References Cited

U.S. PATENT DOCUMENTS

| | | | | |
|---|---|---|---|---|
| 4,438,364 A | * | 3/1984 | Morison | 310/328 |
| 4,725,753 A | * | 2/1988 | Lien et al. | 310/328 |
| 4,736,132 A | * | 4/1988 | Culp | 310/333 |
| 4,882,078 A | * | 11/1989 | Nishimura et al. | 252/62.9 PZ |
| 5,869,189 A | * | 2/1999 | Hagood et al. | 428/461 |
| 6,111,818 A | * | 8/2000 | Bowen et al. | 367/140 |
| 6,280,650 B1 | * | 8/2001 | Ogawa et al. | 252/62.9 PZ |
| 6,284,085 B1 | | 9/2001 | Gwo | |
| 6,548,176 B1 | | 4/2003 | Gwo | |

(Continued)

FOREIGN PATENT DOCUMENTS

| | | |
|---|---|---|
| JP | 2007259670 | 10/2007 |
| WO | WO 2006/091665 | 8/2006 |

OTHER PUBLICATIONS

"A New Fast Inchworm Type Actuator With the Robust I/Q Heterodyne Interferometer Feedback", Moon, Chanwoo et al., Mechatronics, vol. 16, PT 2, pp. 105-110, 2006.

(Continued)

*Primary Examiner* — J M Saint Surin
(74) *Attorney, Agent, or Firm* — W. Kevin Ransom; Moore & Van Allen PLLC

(57) ABSTRACT

A device comprising a solid-state actuator (100), means for inputting an acoustic signal to the actuator (104) and means for measuring the resultant signal (104). The measured acoustic signal can be used to determine the extension of the solid-state actuator.

30 Claims, 8 Drawing Sheets

(56) References Cited

U.S. PATENT DOCUMENTS

| | | | |
|---|---|---|---|
| 6,552,469 B1 * | 4/2003 | Pederson et al. | 310/309 |
| 6,765,335 B2 * | 7/2004 | Wischnewskiy | 310/323.02 |
| 6,847,155 B2 * | 1/2005 | Schwartz et al. | 310/328 |
| 6,998,762 B2 * | 2/2006 | Lubitz et al. | 310/354 |
| 7,046,015 B2 * | 5/2006 | Suginouchi et al. | 324/635 |
| 7,916,879 B2 * | 3/2011 | Pedersen | 381/175 |
| 7,997,145 B2 * | 8/2011 | Venkataraghavan et al. | 73/777 |

OTHER PUBLICATIONS

International Search Report for PCT/GB2008/001794, dated Feb. 12, 2008.

\* cited by examiner (a)                      (b)

EXTENSION SENSING ACTUATOR

FIELD OF THE INVENTION

The present invention relates to solid-state actuators, for example piezo ceramic actuators. In particular, the invention relates to measuring the extension of such actuators.

BACKGROUND OF THE INVENTION

Piezo ceramic actuators are used in a broad range of applications requiring micron scale movements with sub-micron resolution. The movement is made possible by applying a voltage across the actuator material causing the lattice to distort. The direction of the distortion is orientated to result in an extension of the material. The extension capabilities can be enhanced by building up the actuator with multiple, alternate layers of piezo material and electrode.

The extension characteristics of piezo actuators have a high degree of hysteresis and a non-linearity that alter the scale of the hysteresis loop over the range of cyclic applied voltages. The devices will also creep to their final extension. In applications requiring knowledge of position there is a need for accurate measurement of actuator extension.

An established method of making accurate position measurements uses a capacitor sensor. One plate of the capacitor is attached as a reference surface while the other moves with the piezo actuator. A change in gap between the two plates alters the capacitance. As the changes in gap are small, the sensing capacitor is frequently arranged as one arm of a bridge circuit and an AC excitation is used to remove drifts associated with DC measurements.

A problem with capacitor sensors is that complications can arise in dealing with fringing fields round the capacitor plates, which increase the 'apparent' plate area of the capacitor and distort the measurement. In addition, stray capacitances in the associated circuitry can lead to additional distortions, as can electromagnetic interference.

SUMMARY OF THE INVENTION

According to first aspect of the present invention, there is provided a method for measuring the extension of a solid state actuator comprising inputting an acoustic signal to the actuator; measuring the acoustic signal that has passed along the actuator, and using the measured signal to determine the actuator length or a change to that length.

Using knowledge of the input signal and analysis of the return signal, for example, the delay between them, the length of the actuator can be determined. This is a very simple and effective solution to a well-established problem, which goes against conventional teachings.

Conventional theory is that the progress of sound through piezo actuators is virtually constant, because the speed of sound in materials is proportional to their stiffness and inversely proportional to their density. Since piezo ceramic materials become stiffer with applied voltage, and simultaneously less dense, it is generally believed that any changes in speed are cancelled out. In fact, the inventors have found that for piezo actuators sound travels faster as the actuator is extended. This effect is measurable and allows the amount by which the actuator is extended to be quantified. This is unexpected. Neither finite element simulation nor an analytical approach based on effective velocity as a function of strain and Poisson's ratio predict this.

The method may further involve monitoring changes in the measured signal, thereby to determine changes in the actuator length.

The input signal may be transmitted from one end of the actuator; reflected from an opposing end of the actuator and measured at the transmit end. The reflected signal may make multiple passes along the actuator.

The input signal may be transmitted from a point along the actuator and reflected from one or more ends.

The input signal may be transmitted from one end of the actuator and measured at the other end of the actuator.

Two input signals may be input simultaneously from opposing ends of the actuator.

The input and measured signals may be used to determine an actuator transit time, and the method may further involve using the transit time to determine the actuator length or changes in the actuator length.

The method may further involve determining the resonant frequency of the actuator and using this to determine its length or a change in length.

The method may further involve using a transducer to input and measure the acoustic signal; determining the resonant frequency of the transducer and using this to determine length or a change in length of the actuator.

The method may further involve applying a DC voltage to the actuator to cause a change in its length.

The solid-state actuator may be one of: a piezo ceramic actuator; a piezo electric actuator; an electrostrictive actuator.

According to a second aspect of the invention, there is provided a device, in particular, a device or system that has an actuator, a transmitter for transmitting an acoustic signal along the actuator and a receiver for receiving the transmitted signal at one end of the actuator. Preferably the transmitter and/or receiver are at an end of the actuator.

Preferably, piezo actuator comprises layers of ceramic materials and the transmitter and/or receiver are integrated with those layers. For example, one or more electrodes of a multilayer piezo ceramic actuator may be modified so that they act as the transmitter and/or receiver.

Alternatively, the transmitter and/or receiver may be attached to the actuator by for example, epoxy or by a covalent bonding process. Suitable techniques for doing this are described in U.S. Pat. No. 6,548,176 and U.S. Pat. No. 6,284,085, the contents of which are incorporated herein by reference.

The transmitter and receiver may be implemented by the same single element at one end of the actuator. Alternatively the transmitter and receiver may be separate elements located at opposite ends of the actuator.

Means may be provided for using the delay between transmission and reception to determine the actuator length. These may be provided as part of an actuator package or separately, for example in a PC that includes a signal processor for using data received from the actuator to determine its length.

According to another aspect of the invention, there is provided a system comprising means for implementing the method of the first aspect of the invention. The system includes means for inputting an acoustic signal to the actuator; means for measuring the acoustic signal that has passed along the actuator, and means for using the measured signal to determine the actuator length or change in that length.

The means for determining the actuator length may be provided as part of an actuator package or separately, for example in a PC that includes a signal processor for using data received from the actuator.

The system may include a device according to the second aspect of the invention.

BRIEF DESCRIPTION OF THE DRAWINGS

Various aspects of the invention will now be described by way of example and with reference to the accompanying drawings, of which:

FIG. 7 shows frequency domain measurements that using superimposed resonances to determine actuator extension, for a device of the type shown in FIG. 1(c);

FIG. 8 shows frequency domain measurements for a device of the type shown in FIG. 1(a);

DETAILED DESCRIPTION OF THE DRAWINGS

Figure 1:
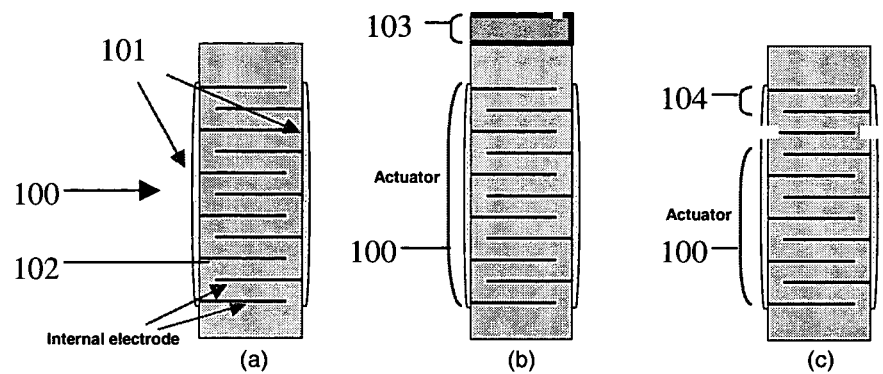
FIG. 1 is a cross sectional view of (a) a multilayer actuator, (b) an actuator with a transducer bonded to it at one end and (c) an actuator with a transducer formed using laminas of the actuator itself.

FIG. 1(a) shows conventional multi layer piezo ceramic actuator 100 comprising a plurality of electrodes interspersed with piezo ceramic layers 102. A common potential difference is applied across each layer via electrodes 101 on opposing external faces of the actuator. In accordance with one embodiment of the invention, an acoustic transducer is acoustically coupled to the actuator, and used to generate and measure acoustic signals to monitor the length or extension of the actuator. By acoustic, it is meant any sound waves, including ultrasonic.

FIG. 1(b) shows an actuator of the general form of FIG. 1(a) that has a separate transducer device 103 acoustically coupled to an external surface for generating an acoustic signal for inputting to the device and measuring the returned acoustic signal. The separate transducer can be attached to the actuator by bonding, for example by using an epoxy or a covalent bonding process, or could be formed using a thin film deposition process. The operating frequency of the transducer is chosen in relation to the size of the actuator and the duration of the transmitted pulse, although it should be higher than the resonant frequency of the actuator.

FIG. 1(c) shows an actuator in which layers of the actuator itself serve as a transducer to transmit an acoustic/ultrasonic pulse and collect the return signal. In this case, part of the laminar structure of the actuator itself acts as a transducer. This transducer is defined by forming isolation trenches through the conventional actuator electrodes to define separate actuator electrodes and transducer electrodes. Alternatively, the transducer electrodes can be formed according to a specific design, and fabricated during manufacture.

The transducers 103 and 104 of FIGS. 1(b) and 1(c) may be operable to generate sound of any suitable frequency, provided it is higher than the resonant frequency of the actuator, although as an example 1.5 MHz would be suitable for a large actuator, e.g. having a stroke of around 30 µm.

Figure 2:
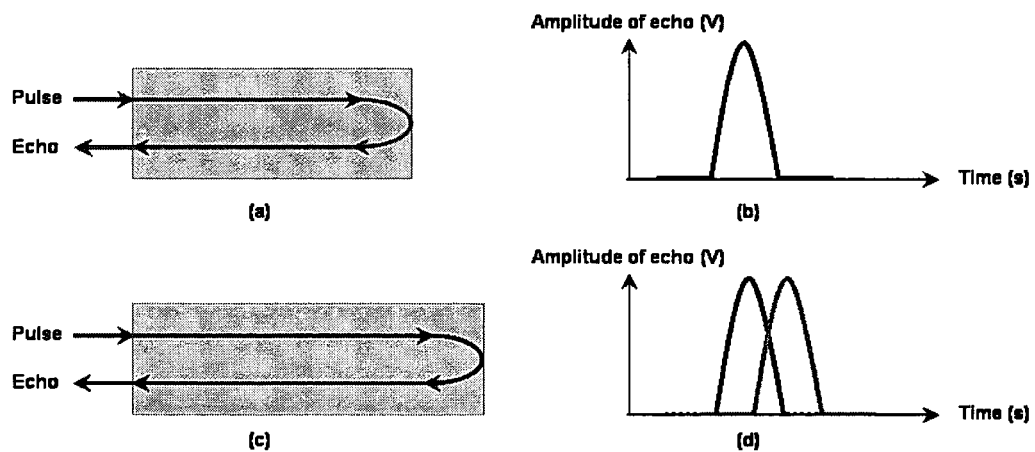
FIG. 2 illustrates the basic operational principle of sensing of extension by ultrasonic means using a time domain measurement.

In the arrangement of FIGS. 1(b) and (c), when an ultrasonic pulse is transmitted at one end of the actuator, an echo is received due to a reflection from the other end of the actuator. When an ultrasonic pulse is transmitted from the transducer 103, 104, a succession of echo signals is reflected from the top and bottom actuator facets. The basic operational principle of sensing of extension by ultrasonic means is illustrated in FIG. 2.

When an ultrasonic pulse is transmitted at one end of a sample, as shown in FIG. 2(a), an echo is received due to a reflection from the other end of the sample. FIG. 2(b) shows the received echo signal in time. In case of a longer sample of the same material, see FIG. 2(c), the received echo is a time-shifted version of the original echo, as shown in FIG. 2(d). By measuring the amount of the time-shift of ultrasonic echoes, the difference in the path-length of ultrasound in the two samples can be deduced.

Figure 3:
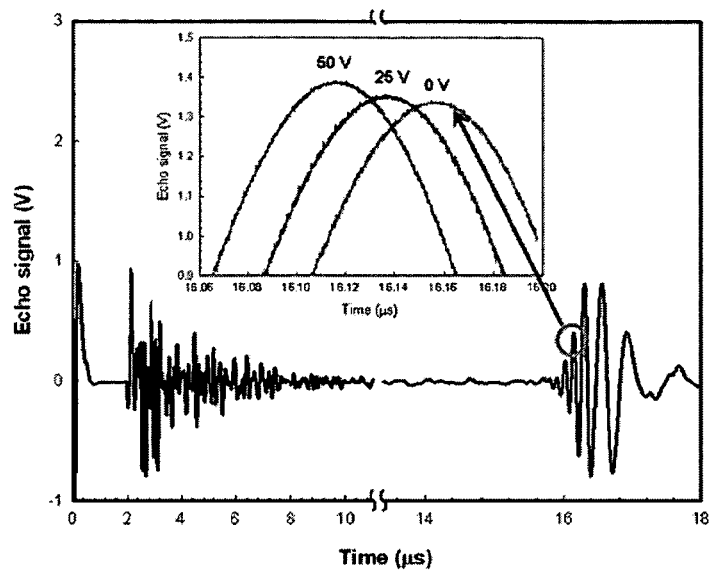
FIG. 3 shows an echo signal for no applied voltage, as well as in the inset, a plot of echo signal for one of the peaks at various different voltages.

FIG. 3 shows the shift in time of one of the peaks of the echo signal as the voltage applied to the actuator is changed. From this it can be seen that as the voltage is increased in steps of 25 V, the peak of the echo signal shifts in steps of 20 ns. This shift can be converted to an equivalent displacement when the acoustic velocity of the actuator material is known. Alternatively, the change in the length of the actuator as a function of time shift could be calibrated. In this case, the length would be determined by merely checking the time shift against, for example, a calibration look-up table.

There are many ways to determine the time-shift. For example, the position of the peak of the echo or the zero-crossing point of the signal could be used. Where there are multiple peaks, any one or more of the echoes could be used, for example the first echo. Alternatively any subsequent echo could be used, as these exhibit cumulatively longer time delays, compared to the signal from the unstressed actuator, which would enable finer displacement resolution. Multiple peaks in the echo could be used to verify or validate the measured time shift. As well as looking at individual peaks, the whole echo signal may be used, instead of only single point of it. In this case, cross-correlation techniques can be used to identify any shifts in the echo. Such techniques are well known and so will not be described herein in detail.

Figure 4:
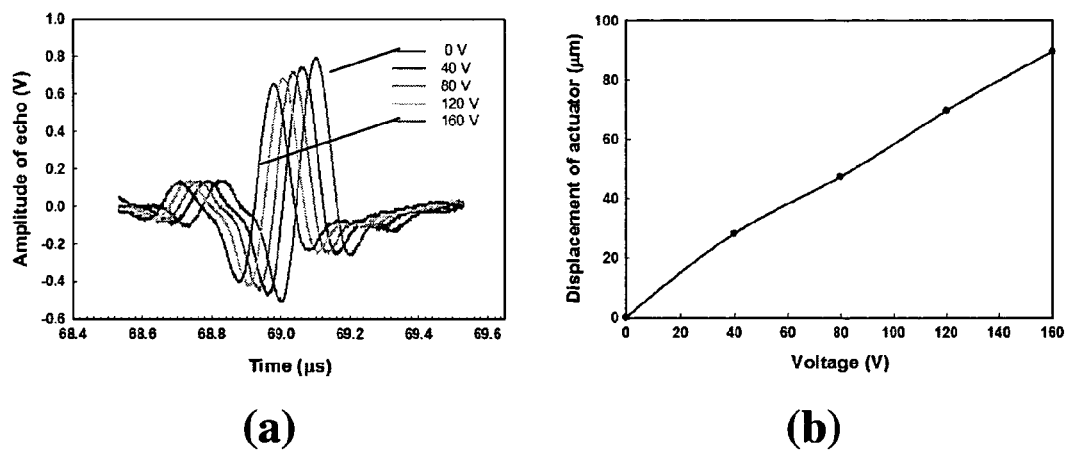
FIG. 4(a) shows a plot of echo signal for various different voltages.
FIG. 4(b) shows a plot of measured actuator displacement as a function of voltage, the displacement being measured simultaneously with the echo signals of FIG. 4(a)
Figure 5:
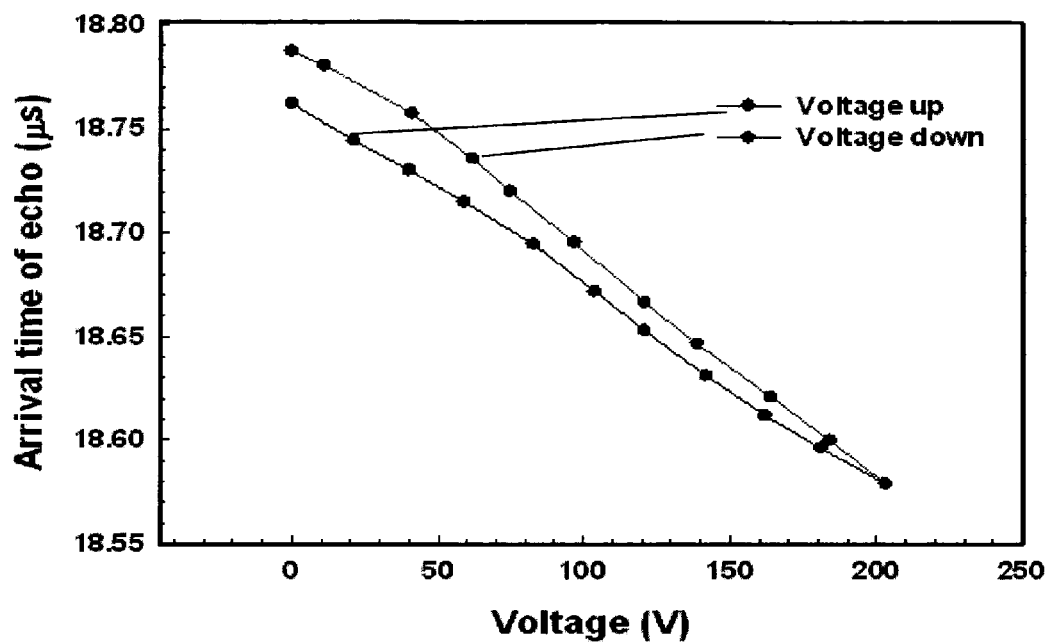
FIG. 5(a) shows a plot of the echo arrival time as a function of voltage for up and down voltage sweeps.
FIG. 5(b) shows a plot of actuator displacement as a function of voltage for up and down voltage sweeps.
Figure 5:
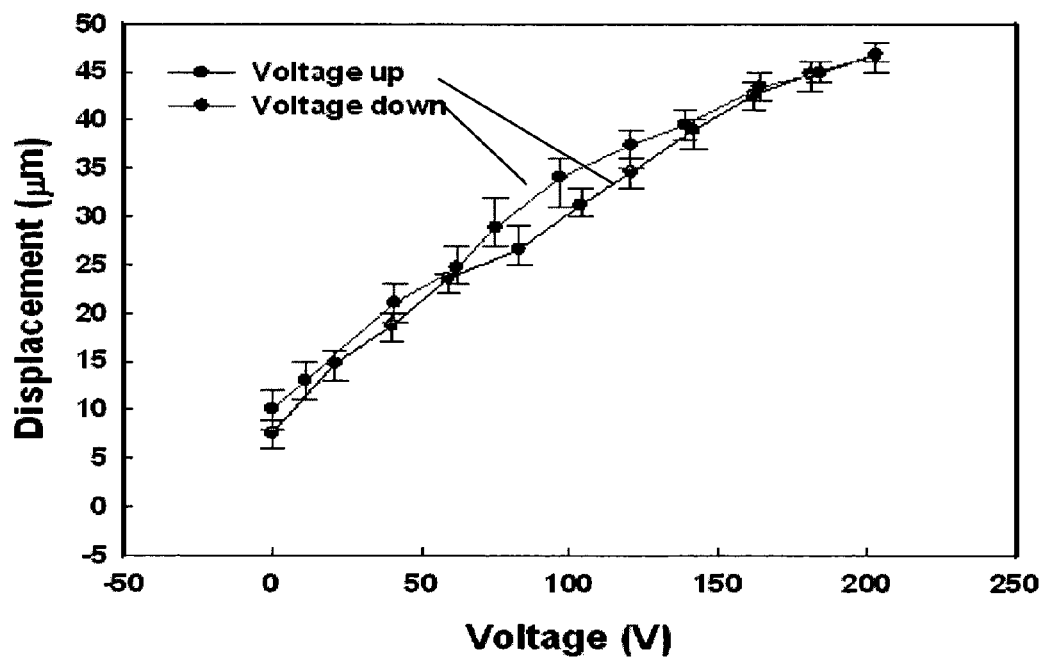

To verify the effectiveness of this technique, a micrometer or an optical displacement sensor was used to measure the extension of the actuator simultaneously with measurement of the time-shift, as a function of applied voltage. As shown in FIG. 4(a), as the applied voltage is increased, the echo arrives earlier, whilst the measured displacement of the actuator becomes longer, as shown in FIG. 4(b). This means that the actuator material becomes acoustically faster as the voltage is increased, which is the opposite of what would be expected. This effect has been shown to be repeatable and uniform, on the same actuator and between different actuators. Further illustration is shown in FIGS. 5(a) and (b).

The systems described above with reference to FIGS. 1 to 5 use changes in the time domain to determine the length of the actuator. However, extension measurements could also be carried out using frequency domain measurements, in which an ac signal is input to either to the transducer or the actuator. There are two options for this, one that is specific to the devices of FIGS. 1(b) and 1(c) and relies on the resonance characteristics of the transducer. The other option relies on monitoring the resonance frequency of the actuator itself without requiring a separate transducer.

Figure 6:
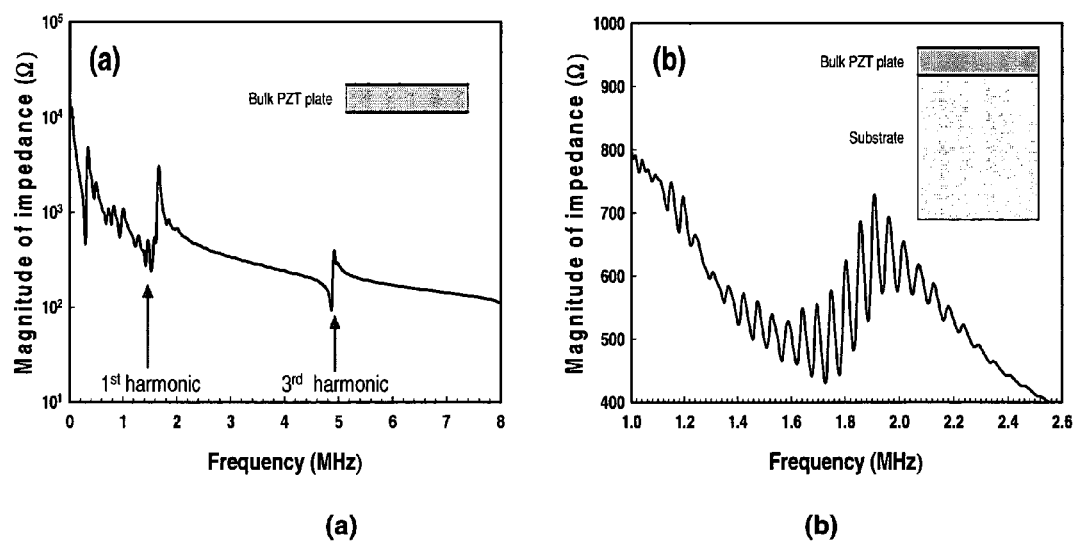
FIG. 6(a) is an impedance spectrum of a PZT transducer.
FIG. 6(b) shows superimposed resonances formed on the main impedance spectrum when the transducer is attached to a substrate to form a device of the type shown in FIG. 1(b)

The first of the frequency domain measurements is based on the utilisation of the resonance characteristics of the transducer. FIG. 6(a) shows an impedance spectrum of 1.5 mm thick PZT transducer, in which the first harmonic (1.6 MHz) and the third harmonic in the thickness mode are indicated by arrows. When the transducer is attached on a 28 mm thick actuator, distinctive superimposed resonances with the peak-to-peak spacing of 54 kHz are observed around the resonance frequency of the transducer, as shown in FIG. 6(b). The spacing between these superimposed resonances is related to the thickness and wave velocity in the actuator, thus providing a practical means to deduce the amount of extension of that actuator.

To test this frequency technique, the device of FIG. 1(c) was used. The material of the laminar structure that defined both the actuator and the transducer was PZT. For the measurements, the PZT transducer was connected to an impedance analyser for measuring its frequency response and the actuator was driven by a dc supply. An optical displacement sensor was used for simultaneous displacement measurements. An extension of 1.50 μm was obtained with applied voltage of 150 V. FIG. 7 shows the results of frequency domain measurements that use superimposed resonances to determine actuator extension.

Figure 7A:
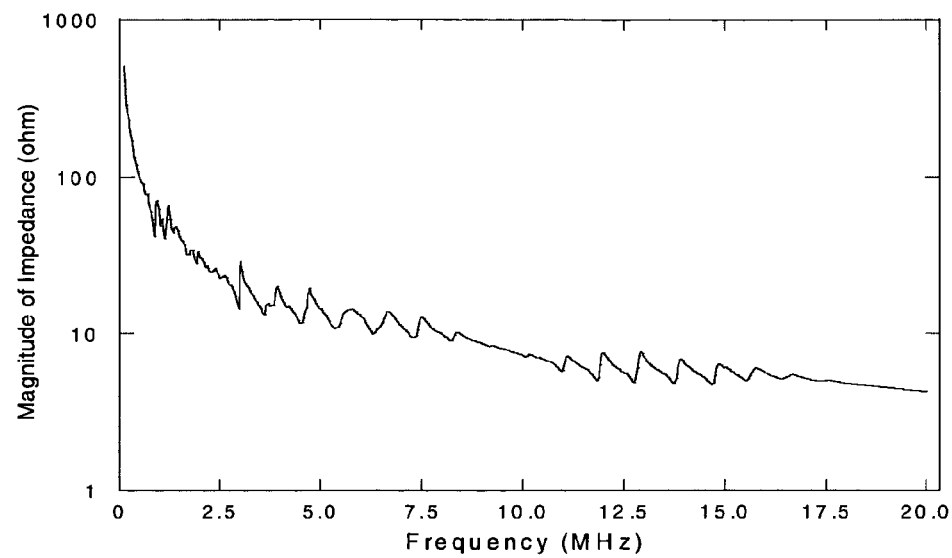
FIG. 7(a) is an impedance spectrum for a monolithically integrated transducer.
Figure 7B:
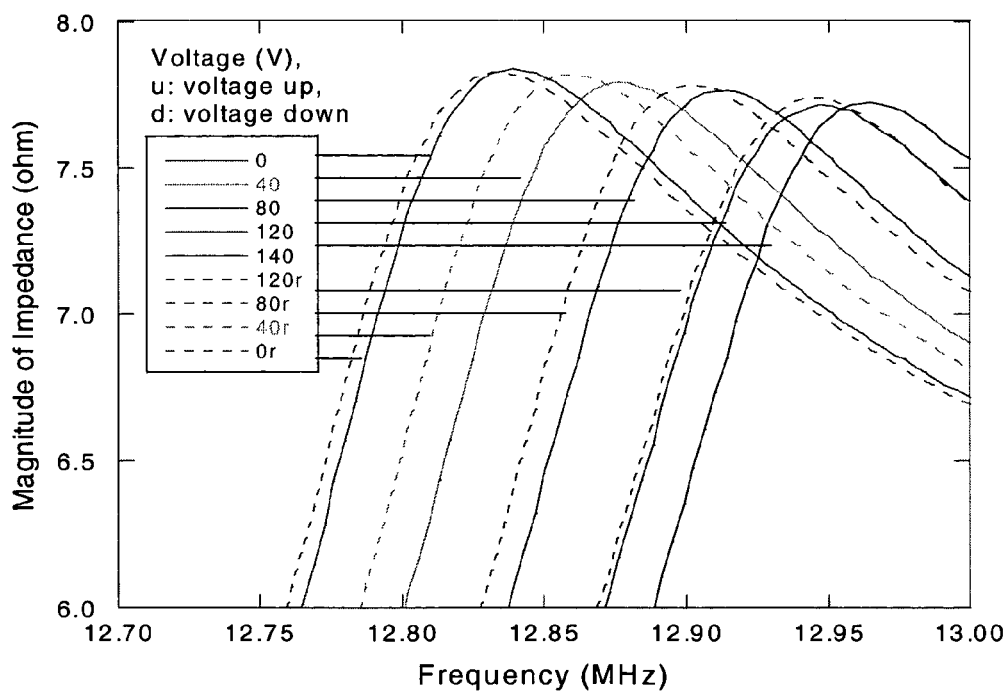
FIG. 7(b) is a plot of impedance spectrum change with applied voltage.
Figure 7C:
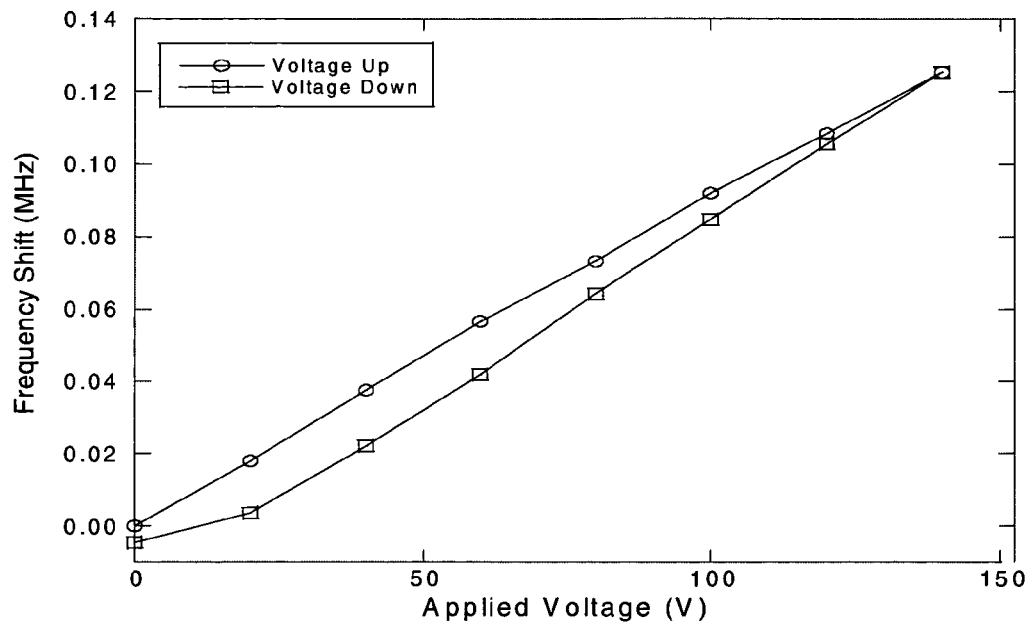
FIG. 7(c) is a plot of frequency shift in superimposed resonances with applied voltage.
Figure 7D:
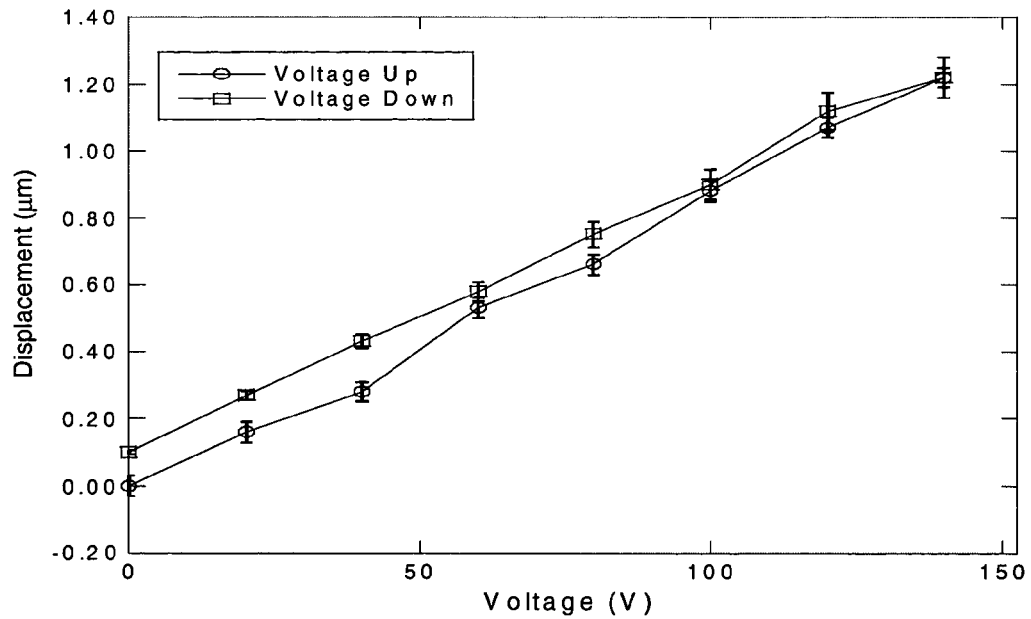
FIG. 7(d) is a plot of actuator displacement versus applied voltage.
Figure 8A:
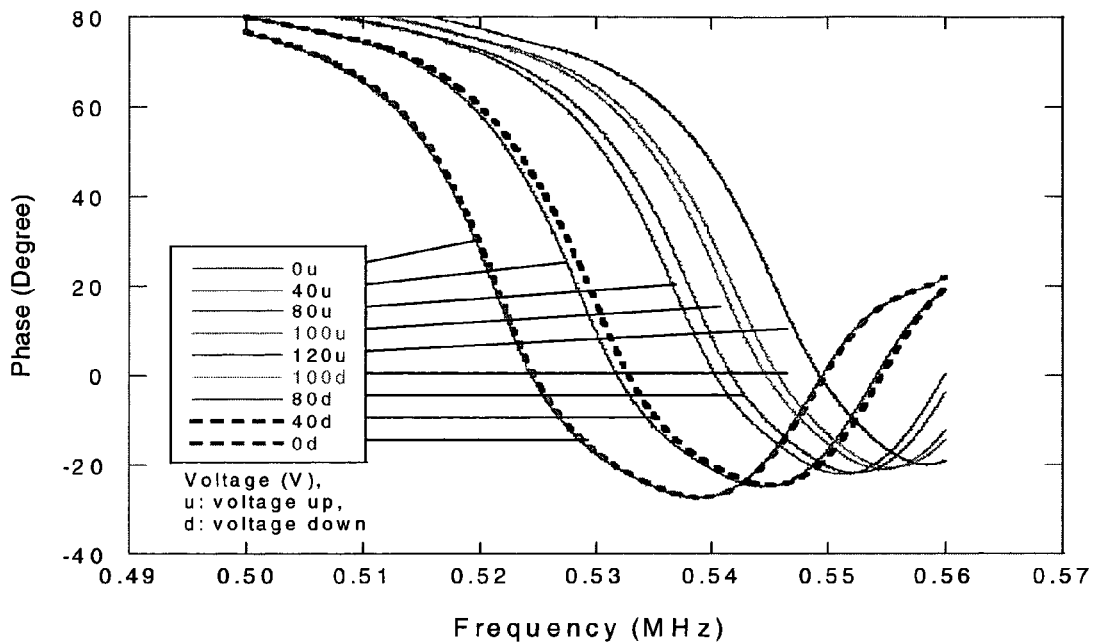
FIG. 8(a) is a plot of change in phase response versus frequency at various different applied voltages.
Figure 8B:
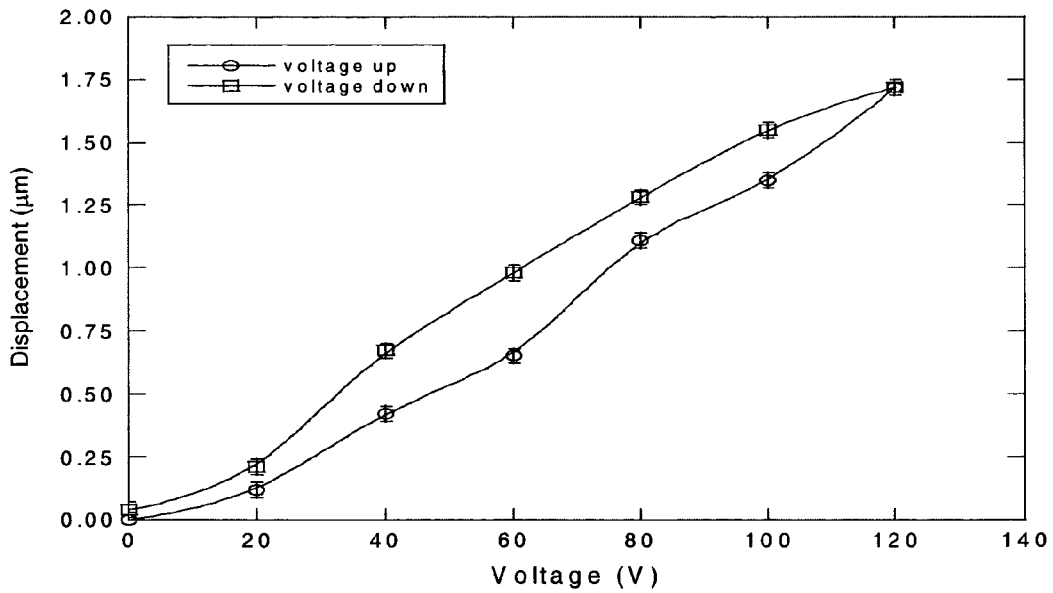
FIG. 8(b) is a plot of measured displacement versus applied voltage.
Figure 8C:
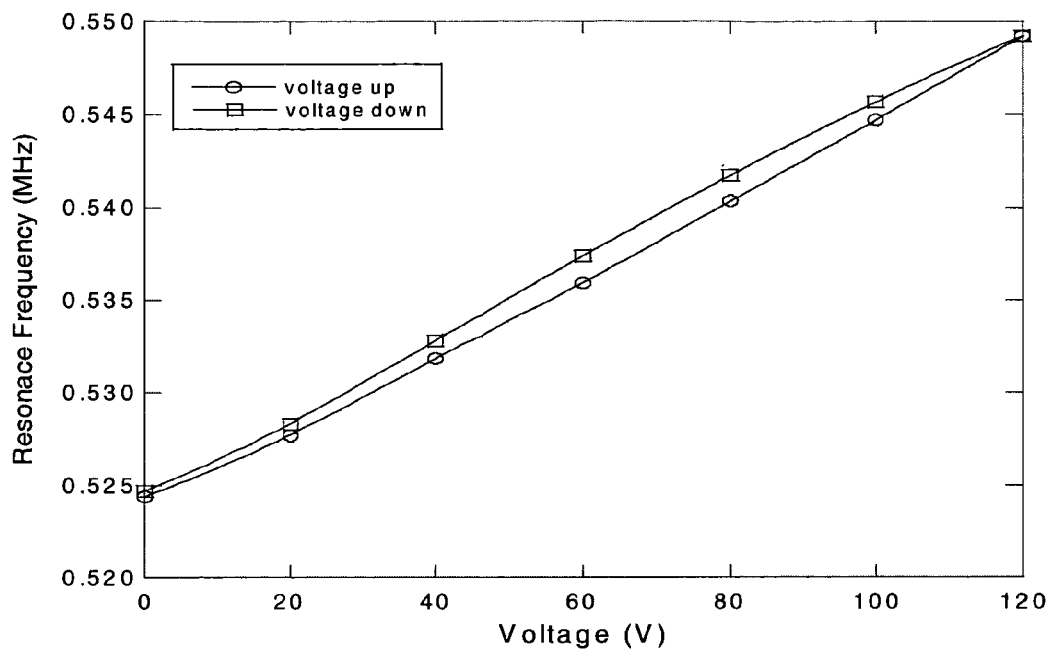
FIG. 8(c) is a plot of resonance frequency shift of the actuator with applied voltage.
Figure 8D:
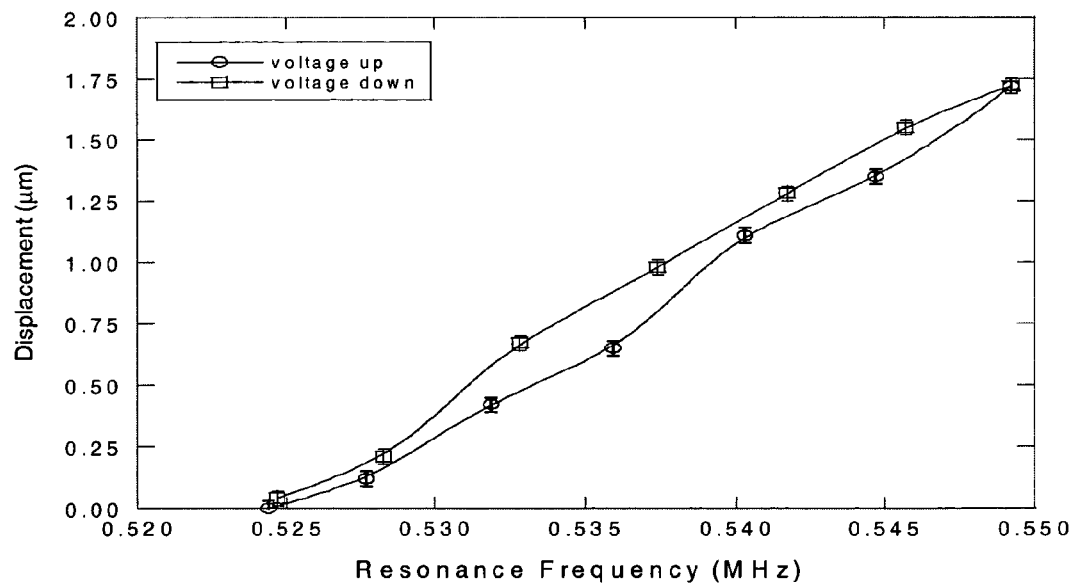
FIG. 8(d) is a plot of displacement versus resonance frequency.

FIG. 7(a) shows an impedance spectrum of the transducer for zero bias. In this, it can be seen that superimposed resonances are formed before and after the thickness mode resonance of the transducer (at 10 MHz). The spacing between superimposed resonances is in the range of 900-1000 kHz. When the applied voltage increases, the superimposed resonances on the transducer impedance spectrum move to the higher frequency, as shown in FIG. 7(b). This phenomenon can be explained by an increased acoustic velocity in the actuator with increased DC bias, just as in the time-domain experiments. The amount of frequency-shift in the superimposed resonances at 12.7 MHz was determined by using the crossing of the impedance spectrum with a reference line corresponding to an impedance value of 7Ω. The frequency shift is almost linear and it is correlated with displacement hysteresis, as shown in FIGS. 7(c) and (d).

The second of the two proposed frequency domain techniques does not require a separate transducer, but instead relies solely on the resonant frequency of the actuator. In this case, the device shown in FIG. 1(a) is used and its resonance frequency is monitored during actuation. To do this, as well as the DC bias to drive the actuator, a variable AC acoustic/ultrasonic signal is applied to the electrodes 101 to determine the resonant frequency. In this case, the DC bias on the actuator must be removed from the measurements by AC coupling.

FIG. 8 shows the results of the second type of frequency domain measurement for a NOLIAC 7×7×2 mm³ PZT actuator. In particular, FIG. 8(a) shows the change in phase response versus frequency at various different applied voltages; FIG. 8(b) shows displacement versus voltage, as measured using an optical displacement sensor; FIG. 8(c) is a plot of resonance frequency shift of the actuator with applied voltage, and FIG. 8(d) is a plot of displacement versus resonance frequency. Hence, merely by monitoring the resonant frequency of the actuator itself, a measure of the extension can be determined.

A skilled person will appreciate that variations of the disclosed arrangements are possible without departing from the invention. For example, although the invention is described in terms of measuring delays in echo signals, it could also function in a through transmission mode. In this case, rather than having a single transducer at one end of the actuator for transmitting the probe signal and receiving the return signal, a separate transmitter and receiver would be provided at opposing ends of the actuator. Equally, whilst only a single transducer is described with reference to FIGS. 1(b) and (c), two such transducers could be provided, preferably at opposing ends of the actuator, so that acoustic signals can be input from both ends of the actuator and measured at both ends. Also, whilst the invention has been described primarily with reference to piezo-electric and piezo-ceramic actuators, other solid-state actuators, such as electrostrictive actuators, could also be used. Tests on PZT actuators (supplied by PI (Physik Instrumente) and NOLIAC) and PMN-PT actuators (supplied by NOLIAC) have demonstrated the effectiveness of the invention. Accordingly the above description of the specific embodiment is made by way of example only and not for the purposes of limitation.

The invention claimed is:

1. A method for measuring the extension of a solid state actuator comprising:
    inputting an acoustic signal to the actuator;
    measuring the acoustic signal that has passed along the actuator; and
    using the measured signal to determine the actuator length or a change to that length.

2. A method as claimed in claim 1 comprising monitoring changes in the measured signal, thereby to determine changes in the actuator length.

3. A method as claimed in claim 1 wherein inputting comprises transmitting the input signal from one end of the actuator where the signal is reflected from an opposing end of the actuator and said measuring comprises measuring the signal at the transmit end.

4. A method as claimed in claim 3 wherein inputting comprises transmitting the input signal from one end of the actuator where the signal is reflected from an opposing end of the actuator and makes multiple passes along the actuator and said measuring comprises measuring the signal at the transmit end.

5. A method as claimed in claim 1 wherein inputting comprises transmitting the input signal from a point along the actuator and reflected from one or more ends.

6. A method as claimed in claim 1 wherein inputting comprises transmitting two input signals simultaneously from opposing ends of the actuator.

7. A method as claimed in claim 1 wherein inputting comprises transmitting the input signal from one end of the actuator and measuring comprises measuring at the other end of the actuator.

8. A method as claimed in claim 1, wherein using comprises using the input and measured signals to determine an actuator transit time, and the method further involves using the transit time to determine the actuator length or changes in the actuator length.

9. A method as claimed in claim 1 comprising determining the resonant frequency of the actuator and using the determined resonant frequency of the actuator to determine its length or a change in length.

10. A method as claimed in claim 1 comprising:
using a transducer to input and measure the acoustic signal; and
determining the resonant frequency of the transducer and using the determined resonant frequency of the transducer to determine length or a change in length of the actuator.

11. A method as claimed in claim 1 comprising applying a DC voltage to the actuator to cause a change in its length.

12. A method as claimed in claim 1 wherein the solid-state actuator is one of: a piezo ceramic actuator; a piezo electric actuator; an electrostrictive actuator.

13. A system comprising means for implementing the method of claim 1.

14. A device comprising:
a solid-state actuator;
means for inputting an acoustic signal to the actuator; and
means for measuring a resultant signal to determine the actuator length or a change to that length.

15. A device as claimed in claim 14 wherein the input means and/or the measuring means are at an end of the actuator.

16. A device as claimed in claim 15 wherein input means and measuring means are provided at both ends of the actuator configured to input acoustic signals at both ends of the actuator and measure acoustic signals at both ends.

17. A device as claimed in claim 14 wherein the actuator comprises layers of material, and the input means and/or the measuring means are integrated with those layers.

18. A device as claimed in claim 17 wherein the input means and/or the measuring means are defined by layers of the same material as the actuator.

19. A device as claimed in claim 18 wherein the input means and/or the measuring means are defined in the same laminar structure as the actuator.

20. A device as claimed in claim 14 wherein input means and/or the measuring means are separate from but attached to the actuator.

21. A device as claimed in claim 20 wherein input means and/or the measuring means are attached using epoxy or by a covalent bonding process.

22. A device as claimed in claim 20 wherein input means and/or the measuring means are formed on the actuator by a thin film deposition process.

23. A device as claimed in claim 14 wherein input means and the measuring means are implemented by the same single element.

24. A device as claimed in claim 23 wherein an input and measurement element is provided at both ends of the actuator.

25. A device as claimed in claim 14 wherein input means and the measuring means are separate elements.

26. A device as claimed in claim 25 wherein the input means and the measuring means are located at opposite ends of the actuator.

27. A device as claimed in claim 14 wherein the solid-state actuator is one of: a piezo ceramic actuator; a piezo electric actuator; an electrostrictive actuator.

28. A system comprising:
a solid-state actuator;
means inputting an acoustic signal to the actuator;
means measuring the acoustic signal that has passed along the actuator; and
means using the measured signal to determine the actuator length or a change to that length.

29. A device comprising:
a solid-state actuator;
an acoustic or ultrasonic transducer or resonator incorporated with said solid-state actuator; and
means for measuring a frequency of the transducer or resonator to determine the solid-state actuator length or a change to that length.

30. A device as claimed in claim 29 wherein the solid-state actuator is one of: a piezo ceramic actuator; a piezo electric actuator; an electrostrictive actuator.

* * * * *